(12) United States Patent
Lo et al.

(10) Patent No.: US 8,378,435 B2
(45) Date of Patent: Feb. 19, 2013

(54) PRESSURE SENSOR AND METHOD OF ASSEMBLING SAME

(76) Inventors: Wai Yew Lo, Petaling Jaya (MY); Lan Chu Tan, Shah Alam (MY)

( * ) Notice: Subject to any disclaimer, the term of this patent is extended or adjusted under 35 U.S.C. 154(b) by 233 days.

(21) Appl. No.: 12/960,571

(22) Filed: Dec. 6, 2010

(65) Prior Publication Data

US 2012/0139063 A1   Jun. 7, 2012

(51) Int. Cl.
*H01L 29/82* (2006.01)
*H01L 21/00* (2006.01)

(52) U.S. Cl. ........... 257/415; 257/E21.04; 257/E21.499; 257/E29.324; 438/51

(58) Field of Classification Search ................. 257/415, 257/E21.04, E21.499, E29.324; 438/51
See application file for complete search history.

(56) References Cited

U.S. PATENT DOCUMENTS

| | | | |
|---|---|---|---|
| 4,314,225 A | 2/1982 | Tominaga | |
| 5,604,363 A | 2/1997 | Ichihashi | |
| 5,692,637 A | 12/1997 | Hodge | |
| 5,719,069 A | 2/1998 | Sparks | |
| 5,811,684 A | 9/1998 | Sokn | |
| 5,831,170 A | 11/1998 | Sokn | |
| 5,874,679 A | 2/1999 | Sokn | |
| 5,996,419 A | 12/1999 | Sokn | |
| 6,094,356 A | 7/2000 | Fujisawa | |
| 6,351,996 B1 | 3/2002 | Nasiri | |
| 6,401,545 B1 | 6/2002 | Monk | |
| 6,900,531 B2 | 5/2005 | Foong | |
| 7,014,888 B2 | 3/2006 | McDonald | |
| 7,469,590 B2 | 12/2008 | Fukuda | |
| 7,549,344 B2 | 6/2009 | Yamamoto | |
| 7,622,324 B2 * | 11/2009 | Enquist et al. | 438/106 |
| 7,632,698 B2 | 12/2009 | Hooper | |
| 7,673,519 B1 | 3/2010 | Fuhrmann | |
| 2004/0016995 A1 * | 1/2004 | Kuo et al. | 257/678 |
| 2005/0236644 A1 | 10/2005 | Getten | |
| 2007/0023873 A1 | 2/2007 | Park | |
| 2010/0281993 A1 | 11/2010 | Lo | |

* cited by examiner

*Primary Examiner* — David S Blum
(74) *Attorney, Agent, or Firm* — Charles Bergere

(57) ABSTRACT

A method of packaging a pressure sensing die includes providing a lead frame with lead fingers and attaching the pressure sensing die to the lead fingers such that bond pads of the die are electrically coupled to the lead fingers and a void is formed between the die and the lead fingers. A gel material is dispensed via an underside of the lead frame into the void such that the gel material substantially fills the void. The gel material is then cured and the die and the lead frame are encapsulated with a mold compound. The finished package does not include a metal lid.

20 Claims, 5 Drawing Sheets

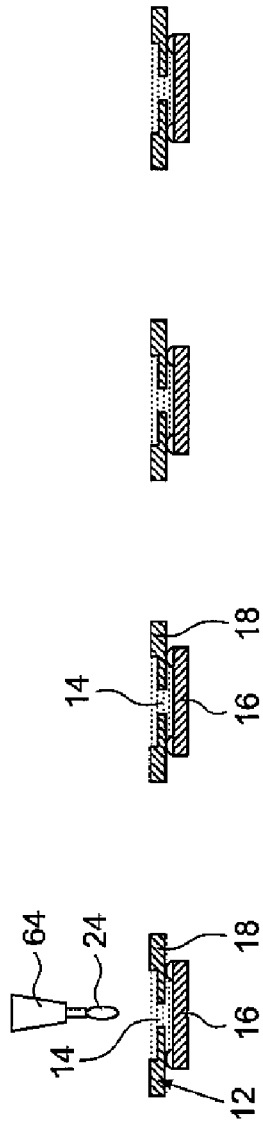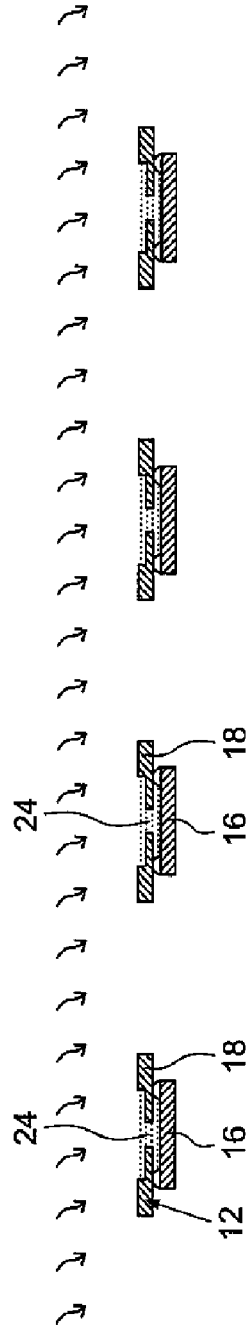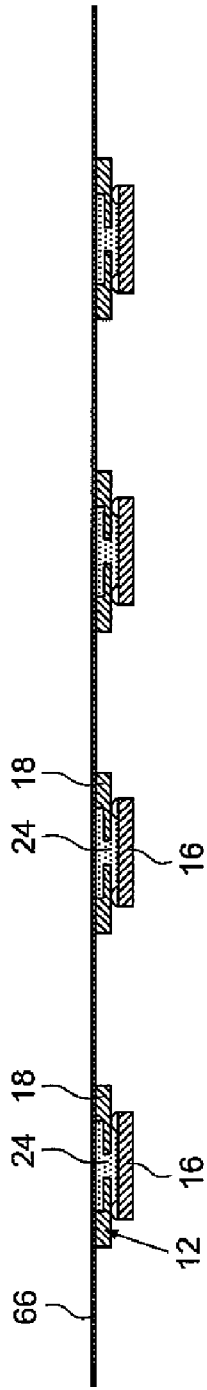

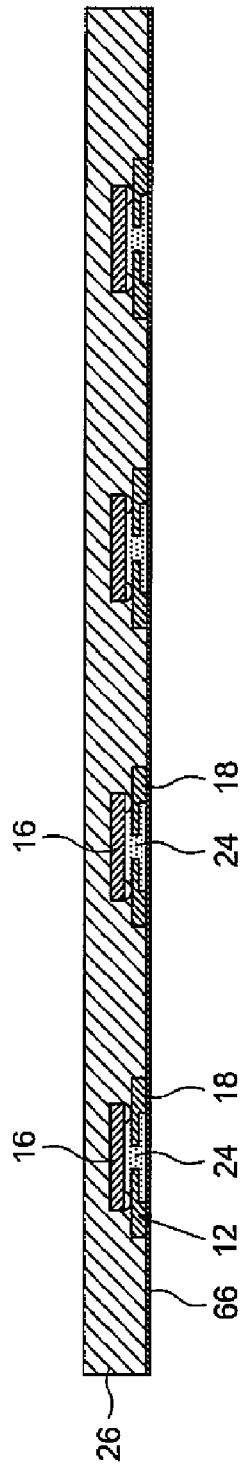
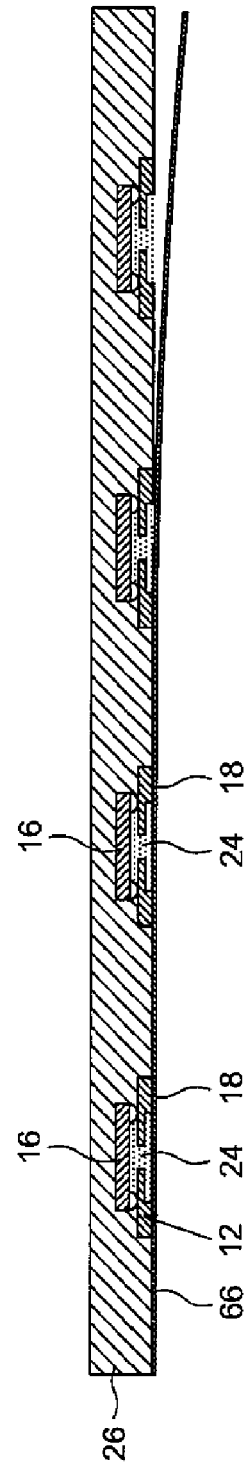
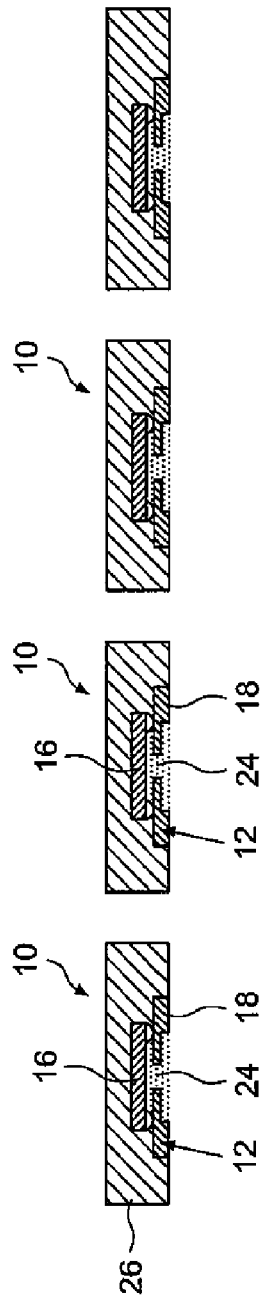
FIG. 3G
FIG. 3H
FIG. 3I

US 8,378,435 B2

PRESSURE SENSOR AND METHOD OF ASSEMBLING SAME

BACKGROUND OF THE INVENTION

The present invention relates generally to semiconductor packaging, and, more particularly, to a method of assembling pressure sensor packages.

Pressure sensors are used in a variety of applications such as industrial, automotive and medical applications. Such sensors typically include a diaphragm at one end that is brought into contact with a media such as a fluid in an environment of interest. During operation, the diaphragm is displaced due to the pressure of the media.

The diaphragm is mechanically coupled to a pressure sensor element, which measures the pressure of the media in the environment based on a physical parameter such as compression, displacement or deformation of the pressure sensor element, with the media pressure being transferred to the pressure sensor element from the diaphragm either directly, or through a mechanical coupling.

The pressure sensor element may include, for example, piezoelectric or piezoresistive crystals to provide an electrical signal indicative of the sensed pressure. One traditional way of packaging the pressure sensor includes leaded packages where the pressure sensor element, diaphragm and the leads are packaged with a lid to cover the pressure sensor element and the diaphragm. However, a problem faced by such packaging techniques is that there is a risk of diaphragm damage because the pressure sensor element is disposed face-up directly below a vent hole. Further, the metal lid used to protect the pressure sensor element adds additional cost to the package and also the package is constrained by the thickness of the lid.

Accordingly, it would be advantageous to be able to efficiently package sensor devices that do not require a lid and the risk of damage to the sensor element and the diaphragm is reduced.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale. For example, the thicknesses of layers and regions may be exaggerated for clarity.

FIG. 3D illustrates a step of dispensing a gel material through an underside surface of the lead frame to fill a void between the pressure sensing die and the lead frame;

FIG. 3E illustrates a step of curing the gel material dispensed in the void in FIG. 3D;

FIG. 3F illustrates a step of covering a surface of the lead frame with a covering material prior to encapsulation of the pressure sensing die and the lead frame with a mold compound;

FIG. 3G illustrates a step of encapsulating the pressure sensing die and the lead frame;

FIG. 3H illustrates a step of removing the covering material from the surface of the lead frame from the encapsulated package of FIG. 3G; and FIG. 3I illustrates a step of separating individual sensor packages of FIG. 3H from each other each other by a singulation process.

DETAILED DESCRIPTION OF THE INVENTION

Detailed illustrative embodiments of the present invention are disclosed herein. However, specific structural and functional details disclosed herein are merely representative for purposes of describing example embodiments of the present invention. The present invention may be embodied in many alternate forms and should not be construed as limited to only the embodiments set forth herein. Further, the terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. It further will be understood that the terms "comprises," "comprising," "includes," and/or "including," specify the presence of stated features, steps, or components, but do not preclude the presence or addition of one or more other features, steps, or components. Terms such as "first" and "second" are used to arbitrarily distinguish between the elements such terms describe. Thus, these terms are not necessarily intended to indicate temporal or other prioritization of such elements. It also should be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In one embodiment, the present invention provides a method of packaging a pressure sensor die. The method includes providing a lead frame having a plurality of lead fingers and attaching the pressure sensor die to the lead fingers of the lead frame. The bond pads of the die are electrically coupled to the lead fingers, and a void is formed between the die and the lead fingers. A gel material is dispensed via an underside of the lead frame into the void such that the gel material substantially fills the void. The gel material is then cured and the die and the lead frame are encapsulated with a mold compound.

In another embodiment, the present invention is a pressure sensor package including a lead frame and a die electrically coupled to the lead frame, where a void is located between the lead frame and die. An internal fill material is disposed within the void between the lead frame and the die. An encapsulation material surrounds the die and the lead frame. The final package does not include a metal lid as typically is required by conventional devices.

Figure 1B:
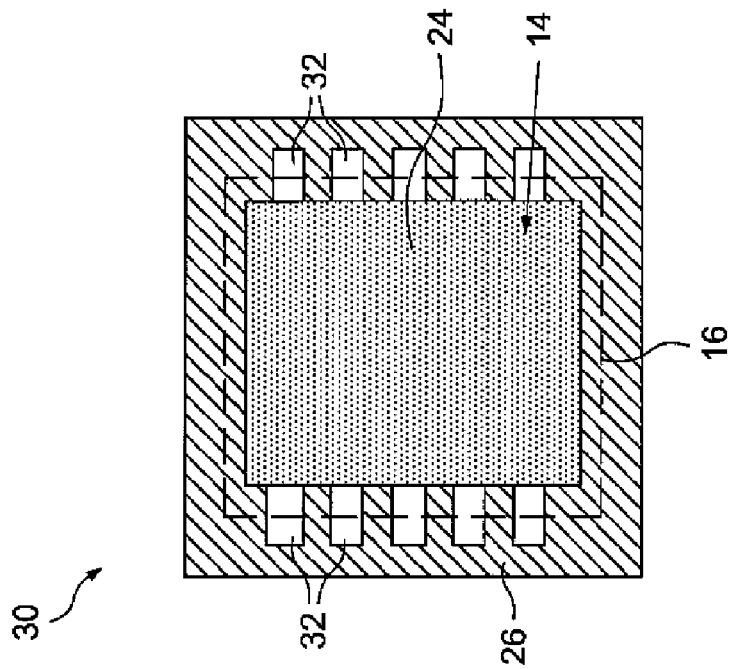
FIG. 1B is an illustration of a bottom sectional view of a dual flat no-leads (DFN) sensor package in accordance with one embodiment of the present invention.
Figure 1A:
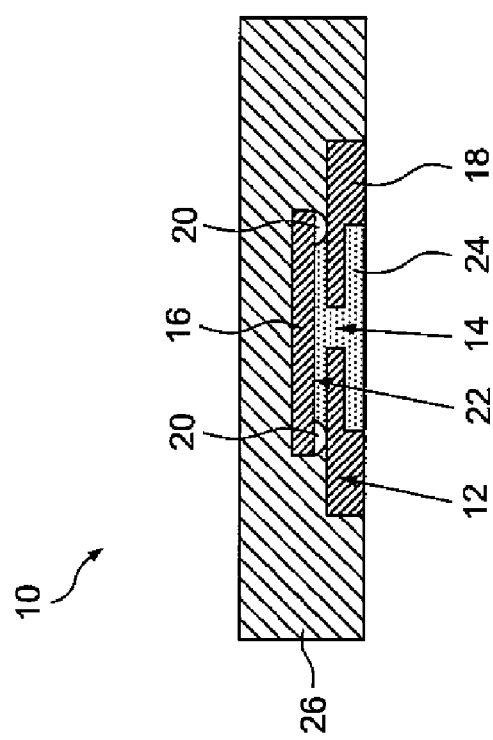
FIG. 1A is an illustration of a cross-sectional side view of a pressure sensor package in accordance with one embodiment of the present invention.

Referring now to FIG. 1A, a cross-sectional view of a pressure sensor package 10 is shown. The pressure sensor package 10 includes a lead frame 12 having a centrally located void 14 and lead fingers 18. A pressure sensing die 16 is electrically coupled to the lead frame 18 such that the die 16 is positioned over the void 14. In this exemplary embodiment of the invention, the pressure sensing die 16 is a piezo-resistive transducer (PRT). The lead frame 12, pressure sensing die 16 and the lead fingers 18 are generally well known components of pressure sensors and thus detailed descriptions thereof are not necessary for a complete understanding of the present invention.

In this exemplary embodiment of the invention, the pressure sensing die 16 is attached and electrically coupled to the lead frame 18 via a plurality of electrically conductive bumps 20 attached to an underside 22 of the pressure sensing die 16. The electrically conductive bumps 20 may include gold stud bumps, copper pillar bumps, solder bumps, or combinations thereof, as should be understood by those of skill in the art. Another way of electrically connecting the pressure sensing die 16 to the lead frame 18 is with wires (not shown). The wires are bonded to pads on an active surface of the pressure sensing die 16 and to corresponding ones of the lead fingers 18 of the lead frame 12, using a well known wire bonding process and known wire bonding equipment.

The pressure sensor package 10 includes an internal fill material 24, such as a silicon-based gel, disposed within the void 14 between the lead fingers 18 and the pressure sensing die 16. An encapsulation material 26 surrounds the pressure sensing die 16 and the lead frame 12. The encapsulation material 26 covers the top and side surfaces of the pressure sensing die 16 and the lead fingers. The encapsulation material 26 may include an epoxy molding compound, as is known in the art.

The example configuration of the pressure sensor package 10 of FIG. 1A may be employed in a flat no-leads package. The package 10 could be trimmed so that side edges of the lead frame are exposed and flush with the side of the package. Thus, it will be understood by those of skill in the art that the drawings are not to scale but instead, are illustrations used to clearly depict the novel aspects of the invention.

Referring now to FIG. 1B, a bottom sectional view of a dual flat no-leads (DFN) sensor package 30 is shown. FIG. 1B shows the encapsulation material 26 that surrounds the die 16 (the outline of the die 16 is shown with dashed lines), the internal fill material (e.g., gel) that fills the void 14 beneath the die 16, and lead fingers 32 that are exposed to provide external electrical communication with the die 16. A surface of the lead fingers 32 is exposed and solder balls (not shown) may be attached to the exposed surface of the lead fingers.

As will be appreciated by one skilled in the art, the pressure sensing die 16 is protected on the one side by the encapsulation material 26 and on the other side (the active side) with the gel material 24. The gel material 24 protects the diaphragm of the die 16 from being damaged due to environmental influences. In certain embodiments, thermal pads may be disposed adjacent to at least two sides of the pressure sensing die 16 to facilitate heat dissipation from the pressure sensor package 30.

Figure 2B:
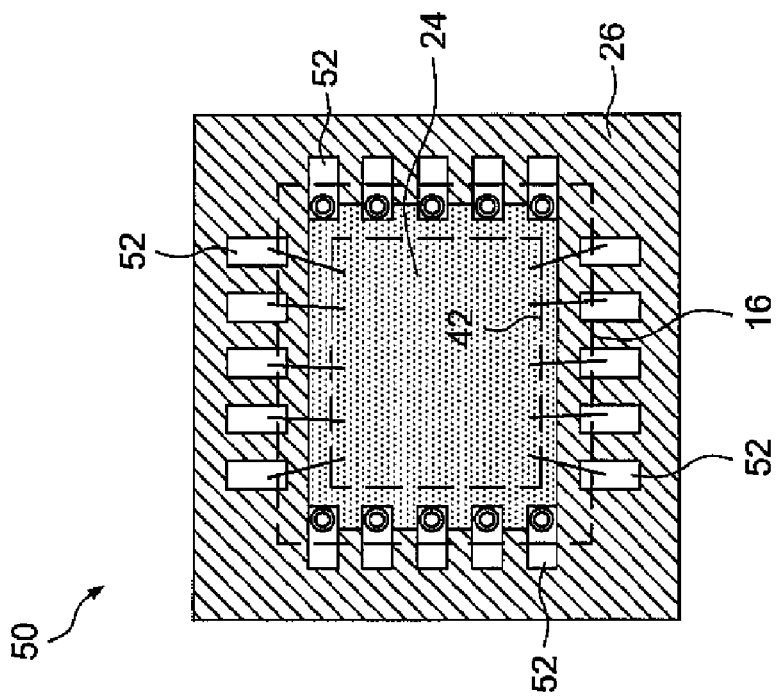
FIG. 2B is an illustration of a bottom sectional view of a quad flat no-leads (QFN) sensor package having the stacked die configuration of FIG. 2A.
Figure 2A:
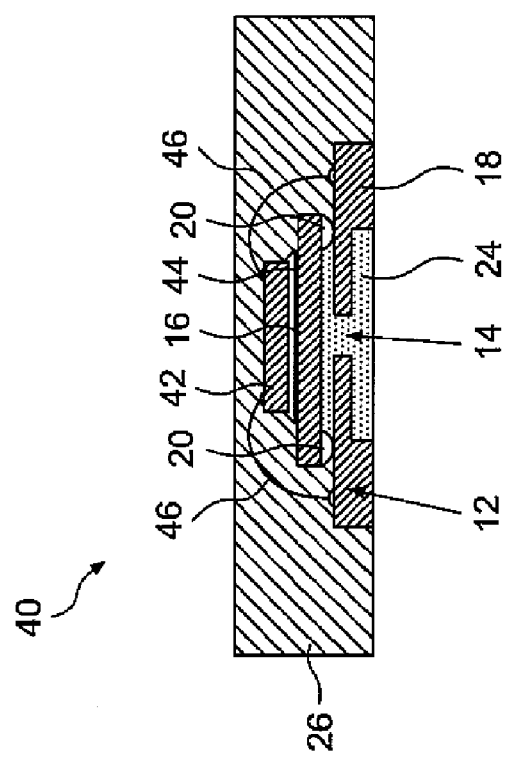
FIG. 2A is an illustration of a cross-sectional side view of a stacked die pressure sensor package in accordance with one embodiment of the present invention.

Referring now to FIG. 2A, a cross-sectional view of a stacked die pressure sensor package 40 is shown. As with the embodiment of FIG. 1A, the pressure sensor package 40 includes the pressure sensing die 16 electrically coupled to the lead fingers 18 of the lead frame 12 via the electrically conductive bumps 20. The pressure sensor package 40 also includes a second die 42 disposed on a top surface 44 of the pressure sensing die 16 and electrically coupled to lead fingers 18 of the lead frame 12 with wires 46. In this exemplary embodiment, the pressure sensing die 16 is a piezo resistive transducer (PRT) and the second die 42 is an application-specific integrated circuit (ASIC). The ASIC 42 is coupled to the lead fingers 18 with the bond wires 46 using a well known wire bonding process and known wire bonding equipment. The ASIC 42 also may be attached to the top or non-active surface of the PRT die 16 with a die attach adhesive or a tape, as is known by those of skill in the art.

In the illustrated embodiment, the gel material 24 fills or substantially fills the void 14 within the lead frame 12 and below the die 16. The pressure sensing die 16, the lead frame 12, the ASIC 42 and the bond wires 46 are encapsulated with the encapsulation material 26 (e.g., mold compound). It should be noted that while the illustrated stacked die pressure sensor package 40 includes two stacked dies 16 and 42, similar packaging may be employed for two dies placed side-by-side on the lead frame 12. Also, like the package 10 shown in FIG. 1A, the sides of the package 40 may be trimmed so that the sides of the lead fingers 18 are flush with the sides of the package 40 and exposed. Exposing the sides of the lead fingers 18 could also be done during singulation by defining the saw streets to be proximate to the outer edges of the lead fingers 18.

Referring now to FIG. 2B, a bottom sectional view of a quad flat no-leads (QFN) sensor package 50 having the stacked die configuration shown in FIG. 2A is shown. Outlines of the first and second (bottom and top or PRT die and ASIC) dies 16 and 42 are shown using dashed lines. The gel material 24 is visible within the void 14 from the bottom of the package 50. As illustrated, the gel material 24 substantially fills the void 14 located inside of the lead frame 12. Also in this view, bottom surfaces 52 of the lead fingers 18 are shown. In this embodiment (QFN), the lead fingers 18 are located on all four sides of the PRT die 16 and the ASIC 42. In one embodiment, the ASIC 42 is coupled to the lead fingers 18 on two opposing sides of the lead frame 12 and the PRT die 16 is coupled to the lead fingers 18 on the other two opposing sides of the lead frame 12. However, this is not a requirement, as it will be understood by those of skill in the art that the coupling, either wires of bumps, to various ones of the lead fingers 18 is possible. The encapsulation material 26 provides the finished outline of the package 50. The encapsulation material 26 covers the PRT die 16, the ASIC 42, the wires 46, and parts of the lead fingers 18, as shown. Advantageously, the packaging employed in the QFN sensor package 50 may be extended to packages with multiple dies placed side by side. It also should be noted that the package 50 neither includes nor requires a metal lid like that used in conventional sensor devices.

Although the individual elements of the pressure sensor packages 10, 30, 40 and 50 themselves comprise well known elements, the structure formed using these elements and the method of assembling the packages 10, 30, 40 and 50 are believed to be novel. Typical sensor assembly processes can cumbersome and require additional components such as a metal lid to protect the individual elements like the pressure sensing die and leads. However, the inventors have invented a novel structure that does not include nor require a metal lid; the method of forming the pressure sensor package 10 will be described with reference to FIGS. 3A-3I. Those of skill in the art should be able to readily add steps necessary to form the stacked die package 40 or packages with side-by-side dies.

Figure 3A:
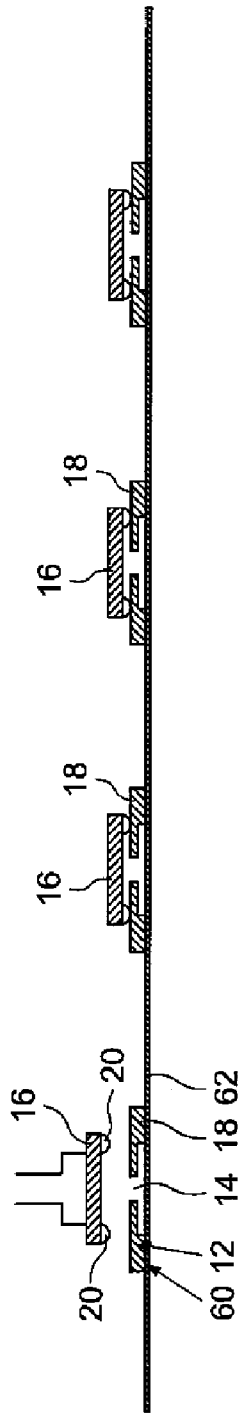
FIG. 3A illustrates a step of electrically coupling a pressure sensing die to a lead frame.

Referring now to FIG. 3A, an illustration of a step of attaching and electrically coupling a plurality of the pressure sensing dies 16 to a corresponding plurality of lead frames is shown. In FIGS. 3A-3H, the lead frames are provided as a strip or array of lead frames. In these drawings, the lead frames and their lead fingers 18 are represented in such a way as to illustrate that the lead frames are provided as a strip or array. Now, again referring to FIG. 3A, a strip or array of lead frames 12 is provided and each of the lead frames includes a plurality of lead fingers 18 that are arranged as either two opposing rows (DFN) or two pairs of opposing rows (QFN). A tape 60 is attached to one side of the lead frames 12 to facilitate simultaneous assembly of multiple packages. The lead fingers 18 surround a central area having a rectangular shape with the lead fingers being arranged along either two or four of the four sides of the rectangle. The pressure sensing dies 16 are attached to respective ones of the lead frames 12 using commercially available pick and place equipment. The dies 16 may be attached to the lead frames with a tape or die attach adhesive in the case of a wire bond package or directly coupled to the lead frame with flip chip bumps if flip chip packaging is employed. In the embodiment shown, the die 16 is electrically coupled to the respective ones of the lead fingers 18 of the lead frames 12 with a plurality of conductive bumps 20. The conductive bumps 20 are placed on bonding pads located on one of the major surfaces 22 of the pressure sensing die 16. The electrically conductive bumps 20 may include gold stud bumps, copper pillar bumps, solder bumps, or combinations thereof. The conductive bumps 20 may be formed or placed on the pressure sensing die 16 using know techniques such as evaporation, electroplating, printing, jetting, stud bumping and direct placement.

Each pressure sensing die 16 is flipped and the conductive bumps are aligned with contact areas (not specifically shown) of the lead fingers 18, as is understood by those of skill in the art.

Figure 3B:
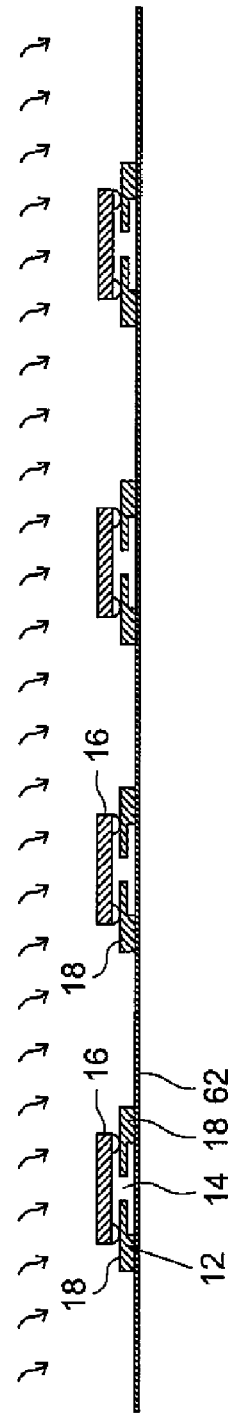
FIG. 3B illustrates a step of reflowing conductive bumps for electrically coupling the pressure sensing die to the lead frame of FIG. 3A.

FIG. 3B is an illustration of a step of reflowing the conductive bumps 20 for electrically coupling the pressure sensing dies 16 to the lead fingers 18 of the lead frames 12. The conductive bumps 20 may be reflowed in a furnace at appropriate temperatures to form spherical bumps for establishing a bond between the pressure sensing die 16 and the lead fingers 18 of the lead frame 12.

Figure 3C:
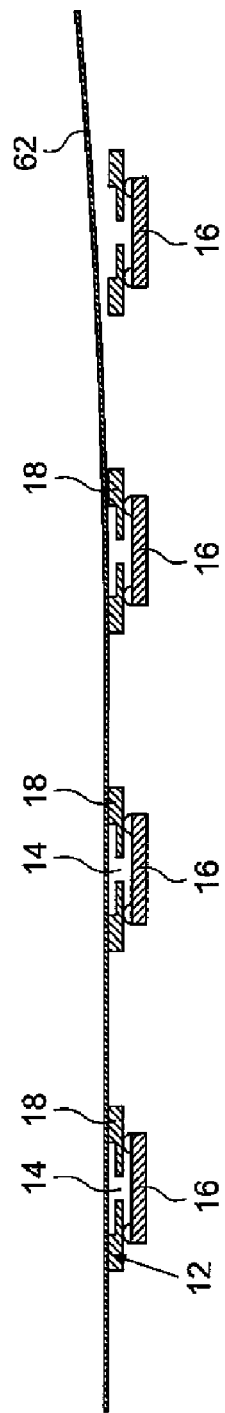
FIG. 3C illustrates a step of inverting the lead frame and the pressure sensing die of FIG. 3B in preparation for a gel dispensing step.

FIG. 3C shows the step of inverting the lead frames 12 and the pressure sensing dies 16 in preparation for a gel dispensing step as will be described with reference to FIG. 3D. In this exemplary embodiment, the lead frames 12 and the pressure sensing dies 16 attached thereto are inverted and the covering material or tape 60 is detached from the surface 62 of the lead frames 12. In one embodiment, a support structure such as a carrier (not shown) may be disposed adjacent to the pressure sensing die 16 to prevent the die 16 from being damaged while the package is being assembled.

FIG. 3D illustrates a gel dispensing step in which the gel material 24 is dispensed through the underside surface 62 of the lead frames 12, between the lead fingers 18, to fill the void 14 located between the pressure sensing die 16 and the lead fingers 18. The gel material 24 may be dispensed using a known gel dispensing device 64 such as a standard syringe and needle apparatus. The gel material 24 flows into the voids 14 via capillary effect to substantially fill the voids 14 that are located between respective ones of the pressure sensing dies 14 and the lead frames 12. The gel material 24 is subsequently cured using a conventional box oven method, as shown in FIG. 3E.

FIG. 3F shows covering the surface 60 of the lead frames 12 with another covering material 66 such as an adhesive tape prior to encapsulation of the pressure sensing die 16 and the lead frame 12 with a mold compound. The covering material 66 is provided to prevent the pressure exerted on the assembly during molding from dislodging the gel material 24 from the void 14. The molding may be performed by transfer molding, injection molding, among other known molding techniques.

The encapsulation material 26 may be a silica-filled resin, a ceramic, a halide free material, or other protective encapsulant layer.

Subsequently, the covering material 66 is removed from the lead frames 12 (i.e., de-taping), as shown in FIG. 3H. FIG. 3I shows individual sensor packages 10 being separated from each other by a singulation process. Singulation processes are well known and may include cutting with a saw or a laser. Excess mold compound 26 may be removed via grinding or other methods so that the outer surfaces of the lead fingers 18 are exposed.

The present invention, as described above, allows for packaging a pressure sensing die that protects the die from any damage due to environmental influences and does not require metal lid to cover the die. The pressure sensing die is attached to a lead frame and a gel material is dispensed via an underside of the lead frame into a void between the die and the lead frame. The gel material is subsequently cured and the die and the lead frame are subsequently encapsulated with a mold material. Thus, the present invention provides a method of packaging a pressure sensing die that is substantially thin and does not require a metal lid to cover the die thereby reducing manufacturing costs for such packages. The pressure sensing die packaged using the process described above is protected as it faces down. The gel material further protects the diaphragm of the pressure sensing die from being damaged.

By now it should be appreciated that there has been provided an improved pressure sensor package and a method of forming the improved semiconductor package. Circuit details are not disclosed because knowledge thereof is not required for a complete understanding of the invention. Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The invention claimed is:

1. A pressure sensor package, comprising:
   a lead frame having a centrally located void;
   a pressure sensing die electrically coupled to the lead frame, wherein the void is located between the lead frame and the pressure sensing die; and
   an internal fill material disposed within the void between the lead frame and the pressure sensing die.

2. The pressure sensor package of claim 1, further comprising an encapsulation material at least partially surrounding the pressure sensing die and the lead frame.

3. The pressure sensor package of claim 2, wherein the encapsulation material comprises an epoxy molding compound.

4. The pressure sensor package of claim 1, wherein the pressure sensor package comprises a flat no-leads type package.

5. The pressure sensor package of claim 1, wherein the internal fill material comprises a silicon-based gel.

6. The pressure sensor package of claim 1, wherein the pressure sensing die comprises a piezo resistive transducer (PRT) die.

7. The pressure sensor package of claim 6, further comprising a second die disposed on a top surface of the PRT die and electrically coupled to the lead frame.

8. The pressure sensor package of claim 7, wherein the second die is coupled to the lead frame via bond wires.

9. The pressure sensor package of claim 1, wherein the pressure sensing die is coupled to the lead frame via a plurality of electrically conductive bumps.

10. The pressure sensor package of claim 1, wherein the lead frames include respective pluralities of lead fingers that provide for the electrical connection between the lead frames and the dies, wherein respective ones of the lead fingers are disposed adjacent to at least two opposing sides of the pressure sensing dies.

11. The pressure sensor package of claim 10, wherein the respective pluralities of lead fingers are disposed adjacent to each of four sides of the pressure sensing dies.

12. A pressure sensor package, comprising:
a lead frame;
at least one die electrically coupled to the lead frame, wherein a void is located between the lead frame and the at least one die;
a gel material disposed within the void between the lead frame and the at least one die; and
an encapsulation material substantially surrounding the at least one die and the lead frame.

13. The pressure sensor package of claim 12, wherein the at least one die comprises one of two stacked dies and two side-by-side dies, wherein the dies include a piezo resistive transducer die and an application-specific integrated circuit die.

14. The pressure sensor package of claim 12, wherein the pressure sensor package comprises one of a dual flat no-leads package and a quad flat no-leads package.

15. A method of assembling a pressure sensor package, comprising:
providing a lead frame having a plurality of lead fingers disposed in at least two opposing rows;
attaching a pressure sensing die to a first surface of the lead frame, wherein a void is formed between the die and the rows of lead fingers of the lead frame;
electrically coupling bond pads of the pressure sensing die to respective ones of the plurality of lead fingers of the lead frame;
dispensing a gel material into the void such that the gel material substantially fills the void and covers an active surface of the pressure sensing die;
encapsulating the pressure sensing die and the lead frame with a mold compound, wherein the mold compound covers the pressure sensing die, electrical connections between the pressure sensing die and the lead frame, and the lead frame except that a second surface of the lead fingers of the lead frame is exposed to allow external electrical connection to the pressure sensing die.

16. The method of packaging a pressure sensing die of claim 15, wherein the pressure sensing die is attached and electrically coupled to the lead fingers via a plurality of conductive bumps and the electrically coupling step comprises performing a reflow operation.

17. The method of assembling a pressure sensor package of claim 16, further comprising inverting the lead frame and the pressure sensing die then injecting the gel material through the lead frame and into the void, and curing the gel material.

18. The method of assembling a pressure sensor package of claim 17, further comprising covering a second surface of the lead frame with a tape, opposite the lead frame first surface, before the encapsulation step, and removing the tape after the encapsulation step, wherein after the tape is removed, at least a portion of the second surface of the lead frame is exposed.

19. The method of packaging a pressure sensing die of claim 17, further comprising covering a surface of the lead frame opposite the pressure sensing die before attaching of the pressure sensing die to the lead frame, and removing the covering before dispensing the gel material.

20. The method of packaging a pressure sensing die of claim 15, wherein the lead frame has a tape on a second surface thereof prior to attaching the pressure sensing die to the lead frame first surface and said tape is removed after the reflow operation is performed.

\* \* \* \* \*